(12) United States Patent
Ikeda

(10) Patent No.: US 8,258,676 B2
(45) Date of Patent: Sep. 4, 2012

(54) CRYSTAL DEVICE AND METHOD FOR MANUFACTURING CRYSTAL DEVICE

(75) Inventor: Tomoo Ikeda, Tokorozawa (JP)

(73) Assignee: Citizen Holdings Co., Ltd., Tokyo (JP)

( * ) Notice: Subject to any disclaimer, the term of this patent is extended or adjusted under 35 U.S.C. 154(b) by 185 days.

(21) Appl. No.: 12/801,020

(22) Filed: May 17, 2010

(65) Prior Publication Data

US 2010/0223769 A1 Sep. 9, 2010

Related U.S. Application Data

(62) Division of application No. 11/630,154, filed as application No. PCT/JP2005/010528 on Jun. 2, 2005, now abandoned.

(30) Foreign Application Priority Data

Jun. 21, 2004 (JP) .................................. 2004-181930

(51) Int. Cl.
*H01L 41/00* (2006.01)
*H02N 2/00* (2006.01)

(52) U.S. Cl. ................... 310/323.06; 310/367; 310/370; 73/514.01; 73/514.36

(58) Field of Classification Search ........................ None
See application file for complete search history.

(56) References Cited

U.S. PATENT DOCUMENTS

| | | | | |
|---|---|---|---|---|
| 4,415,827 A | * | 11/1983 | Chuang | ........................ 310/370 |
| 5,723,790 A | | 3/1998 | Andersson | |
| 6,949,870 B2 | | 9/2005 | Ono et al. | |
| 7,859,173 B2 | * | 12/2010 | Ichikawa | ....................... 310/370 |
| 2002/0089386 A1 | | 7/2002 | Kitamura et al. | |
| 2003/0080652 A1 | | 5/2003 | Kawashima | |
| 2005/0122006 A1 | * | 6/2005 | Matsudo et al. | .............. 310/370 |
| 2006/0250051 A1 | * | 11/2006 | Matsudo et al. | .............. 310/370 |

FOREIGN PATENT DOCUMENTS

| | | |
|---|---|---|
| CN | 1361590 A | 7/2002 |
| JP | 52137991 A | 11/1977 |
| JP | 55-125714 | 9/1980 |
| JP | 57116408 | 7/1982 |
| JP | 59-83412 | 5/1984 |
| JP | 2004-72609 | 3/2004 |
| JP | 2005-167992 | 6/2005 |

OTHER PUBLICATIONS

Office Action dated Apr. 6, 2010 issued in corresponding Japanese Application No. 2006-514707.

* cited by examiner

*Primary Examiner* — Duy Deo
(74) *Attorney, Agent, or Firm* — Finnegan, Henderson, Farabow, Garrett & Dunner, L.L.P.

(57) ABSTRACT

A crystal device that has stable vibration characteristics and that offers high reliability and high accuracy. The crystal device includes a first major face, which contains a portion of a base and a portion of a vibrating prong within a single plane, formed on the crystal plate, and a second major face, which contains another portion of the base and another portion of the vibrating prong within a single plane, formed on a crystal plate, wherein the first major face and the second major face have different outer shapes. The shapes of the first and second major faces can be produced by first forming mask layer patterns on a crystal substrate by exposure through different mask patterns and then etching the crystal substrate using the thus formed mask layer patterns.

3 Claims, 17 Drawing Sheets

PRIOR ART

PRIOR ART

PRIOR ART

CRYSTAL DEVICE AND METHOD FOR MANUFACTURING CRYSTAL DEVICE

RELATED APPLICATIONS

This application is a divisional of U.S. application Ser. No. 11/630,154, filed Dec. 20, 2006 now abandoned, which is a §371 of PCT application No. PCT/JP2005/010528 filed Jun. 2, 2005 which claims priority of Japanese application No. 2004-181930 filed Jun. 21, 2004, the contents of all of which are incorporated herein by reference.

FIELD OF INVENTION

The present invention relates to a crystal device comprising a base and a plurality of vibrating prongs protruding from the base, and a fabrication method for the same; more particularly, the invention relates to a tuning-fork type crystal gyro to be used as an angular velocity, sensor, and a fabrication method for the same.

BACKGROUND OF THE INVENTION

With the widespread use of compact and high-accuracy products such as HDDs (Hard Disk Drives), mobile computers, portable telephones, car telephones, and other mobile communication apparatus in recent years, there has developed an increasing need to further enhance the reliability and accuracy of crystal devices, typically crystal oscillators, used in these products.

The need for increased reliability and increased accuracy has been growing, among others, for crystal gyros used for angular velocity detection in navigation systems or for camera shake control in video cameras.

FIG. 14 is a diagram showing the structure of a prior art tuning-fork type crystal device.

The structure of the prior art tuning-fork type crystal device will be described below (for example, refer to Patent Document 1). The prior art tuning-fork type crystal device 2 comprises: a tuning-fork-shaped crystal plate 11 having a base 2a formed from a crystal and vibrating prongs 2b protruding the base; and electrodes 501 and 511 for generating an electric field across the crystal plate 11. In FIG. 14, the vibrating prongs 2b each refer to the portion from the tip to the first bend of the fork just before the base 2a thereof, and the base 2a refers to the portion beyond the bend.

A prescribed electric field can be produced across the crystal plate 11 by applying different potentials to the respective electrodes 501 and 511. Since the crystal plate 11 is a piezoelectric material, when an electric field is applied across the plate the plate contracts or expands according to the direction of the electric field. As a result, the vibrating prongs 2b of the crystal plate 11 vibrate, and the structure can thus be used as a crystal oscillator 2.

Next, a fabrication method for the prior art tuning-fork type crystal device will be described.

FIG. 16 is a diagram showing part of the fabrication process of the prior art tuning-fork type crystal device. First, as shown in FIG. 16A, a crystal substrate 15 is prepared by forming mask layers 21 and 22 and resist layers 31 and 32 one on top of the other on both the upper and lower surfaces of the substrate. Then, the resist layers 31 and 32 formed on both surfaces of the crystal substrate 15 are exposed to UV radiation of prescribed wavelength through masks 41 of the same mask pattern 41a. The resist layers 31 and 32 are exposed only in portions where the mask pattern 41a is not formed.

Next, the resist layers 31 and 32 are developed as shown in FIG. 16B, forming resist layer patterns 31b and 32b. Here, the resist layer patterns 31b and 32b are each formed in the same shape as the mask pattern 41a of the mask 41.

Further, by using the resist layer patterns 31b and 32b as the masks, the mask layers 21 and 22 are etched as shown in FIG. 16C, forming mask layer patterns 21b and 22b. In this way, the mask layer patterns 21b and 22b are each formed in the same shape as the mask pattern 41a of the mask 41.

Next, the resist layer patterns 31b and 32b are removed as shown in FIG. 16D.

Thereafter, the crystal substrate 15 is etched as shown in FIG. 16E, thus producing the outer shape of the crystal plate 11.

FIG. 17 is a diagram showing the shape of the crystal plate formed by the prior art etching and the shapes of the mask layer patterns for comparison.

As shown in FIG. 17, the major faces 211 and 221 of the crystal plate 11 formed by the etching in FIG. 16E, which were the plane surfaces of the crystal substrate 15, are formed in substantially the same shapes as the respective mask layer patterns 21b and 22b. Since the mask layers 21b and 22b are both substantially the same in shape as the mask pattern 41a, it follows that the two major faces 211 and 221 of the crystal plate 11 are both formed in substantially the same shape.

After the etching in FIG. 16E, the mask layer patterns 21b and 22b are removed, and the electrodes 501 and 511 are formed, completing the fabrication of the tuning-fork type crystal device 2 shown in FIG. 14.

The structure and the fabrication method of the tuning-fork type crystal device according to the prior art described above are used for crystal resonators, crystal oscillators, crystal gyros, and various other applications.

In the prior art tuning-fork type crystal device, it is common practice to form the crystal plate 11 by etching. However, since the crystal has the property that its reaction rate differs depending on the direction it is etched (this property is generally called the anisotropic etching property), a ridge-like unetched portion 111 projecting from a side face is necessarily formed, as shown in FIG. 14, in an intermediate region of the base 2a connecting between the vibrating prongs 2b, that is, in FIG. 14, the portion that originates from the tip of one vibrating prong 2b, passes through the root of the one vibrating prong 2b and through the root of the other vibrating prong 2b, and leads to the tip of that other vibrating prong 2b (this portion is generally referred to as the crotch portion).

When the unetched portion 111 is formed, as shown in FIG. 14, the vibrating prong 2b which should normally vibrate in the X-axis direction vibrates in a direction slightly tilted toward the Z-axis direction as indicated by W1. The vibration W1 produced by tilting toward the Z-axis direction tends to tilt greater toward the Z-axis direction as the unetched portion 111 becomes larger.

FIG. 15 is a diagram showing an enlarged view and a side view of the crotch portion of the tuning fork and its adjacent regions in the prior art tuning-fork type crystal device. Here, FIG. 15(b) shows the shape of the side face as viewed from the direction C in FIG. 15(a). As shown in FIG. 15(b), the unetched portion 111 is formed on the side face of the crystal plate 11 in the shape of a ridge extending obliquely from one major face 211 to the other major face 221 of the crystal plate 11. This produces the same effect as if a prop were placed obliquely across the root portion of the vibrating prong 2b and, with this effect, the direction of vibration is tilted toward the Z-axis direction, producing the vibration W1. In this patent specification, the root refers to the portion at the boundary between the vibrating prong 2b and the base 2a; in FIG. 15(a), the bend corresponds to the root.

Further, as shown in FIG. 15(a), the unetched portion 111 left after the etching is formed only on one vibrating prong side of the crotch portion of the tuning fork, and as a result, the left and right vibrating prongs 2b vibrate in different directions, as shown in FIG. 14.

When the direction of vibration of any one vibrating prong 2b is unstable as described above, the resulting crystal device is often unstable and inaccurate in operation; in the prior art, therefore, the balance between the directions of vibration has been adjusted after forming the crystal plate 11, by performing an additional processing step for appropriately removing portions of the electrodes 501 and 511 and the crystal plate 11.

One proposal has been made in Patent Document 1 to stabilize the vibration of the crystal device. The proposal made in Patent document 1 aims to stabilize the vibration of the crystal device by optimizing the plan shape of the crystal plate 11 according to Patent Document 1, it is stated that the plan shape of one major face 201 is the same as the plan shape of the other major face 211.

However, according to experiments conducted by the present inventors, it has been confirmed that, as long as the plan shape of one major face 201 of the crystal plate 11 is the same as the plan shape of the other major face 211, no appreciable change occurs in the shape of the unetched portion 111 and, in most cases, the unetched portion 111 which causes the unstable vibration is formed in substantially the same shape, though its size may vary somewhat. That is, to whatever shape the mask pattern 41a of the mask 41 alone is optimized that determines the plan shape of the crotch portion of the tuning fork, as shown in Patent Document 1, the unetched portion 111 which causes the unstable vibration is necessarily formed as long as the mask pattern 41a of the same shape is used for both the major faces 201 and 211.

In the case of a crystal gyro as one application example of the tuning-fork type crystal device, the vibration tilted toward the Z axis such as the vibration W1 shown in FIG. 14 becomes a very serious problem. The reason is that, in the crystal gyro, the Z-axis direction is nothing but the direction of the angular velocity to be detected, and any vibration in the Z-axis direction, such as the vibration W1, can affect the accurate detection of the angular velocity. As a result, the prior art crystal gyro has had the problem of low accuracy and low reliability.
Patent Document 1: Japanese Unexamined Patent Publication No. H10-41772 (page 2, FIGS. 2 and 3)

SUMMARY OF THE INVENTION

It is an object of the present invention to provide a crystal device and a method for manufacturing the same that can overcome the prior art problem.

It is another object of the present invention to provide a high-accuracy and high-reliability crystal device and a method for manufacturing the same.

It is a further object of the present invention to provide a high-accuracy and high-reliability crystal gyro that can accurately detect angular velocity by using the crystal device of the invention in the crystal gyro, and a method for manufacturing such a crystal gyro.

A crystal device according to the present invention has a crystal plate that includes a base and a plurality of vibrating prongs protruding from the base, wherein two major faces, each containing the base and the plurality of vibrating prongs, are formed on the crystal plate, and wherein the two major faces have respectively different outer shapes.

A crystal device according to the present invention has a first major face, which contains a portion of the base and a portion of the vibrating prong within a single plane, and a second major face, which contains another portion of the base and another portion of the vibrating prong within a single plane, are formed on the crystal plate, wherein the first major face and the second major face have different outer shapes.

Preferably, in the crystal device according to the present invention, the crystal plate includes at least a first vibrating prong and a second vibrating prong. Further preferably, the first and second major faces each have a crotch portion defined by a line that originates from the tip of the first vibrating prong, passes through the root of the first vibrating prong and through the root of the second vibrating prong, and leads to the tip of the second vibrating prong, wherein the crotch portion of the first major face and the crotch portion of the second major face have different shapes.

Preferably, in the crystal device according to the present invention, the number of bends contained in the crotch portion of the first major face is different from the number of bends contained in the crotch portion of the second major face.

Preferably, in the crystal device according to the present invention, the angle of a bend contained in the crotch portion of the first major face is different from the angle of a bend contained in the crotch portion of the second major face.

Preferably, in the crystal device according to the present invention, the number of center points representing curved sections contained in the crotch portion of the first major face is different from the number of center points representing curved sections contained in the crotch portion of the second major face.

Preferably, in the crystal device according to the present invention, the curvature of a curved section contained in the crotch portion of the first major face is different from the curvature of a curved section contained in the crotch portion of the second major face.

A method for manufacturing a crystal device according to the present invention, the crystal device having a crystal plate that includes a base and a plurality of vibrating prongs protruding from the base, includes the steps of forming a resist layer made of a photosensitive material and a mask layer having corrosion resistance to etching of a crystal on each of two plane surfaces of a crystal substrate, exposing the resist layer formed on one plane surface of the crystal substrate to radiation through a first mask on which a first mask pattern of a prescribed shape is drawn and exposing the resist layer formed on the other plane surface of the crystal substrate to radiation through a second mask on which a second mask pattern is drawn that differs in shape from the first mask pattern, forming a first resist layer pattern by patterning the resist layer on the one plane surface of the crystal substrate into a shape corresponding to the first mask pattern, and forming a second resist layer pattern by patterning the resist layer on the other plane surface of the crystal substrate into a shape corresponding to the second mask pattern, forming a first mask layer pattern by patterning the mask layer on the one plane surface of the crystal substrate into the shape corresponding to the first mask pattern, and forming a second mask layer pattern by patterning the mask layer on the other plane surface of the crystal substrate into the shape corresponding to the second mask pattern, and forming the crystal plate in a desired shape by etching the crystal substrate using the first mask pattern and the second mask pattern as masks.

The method according to the present invention includes the steps of forming a resist layer made of a photosensitive material and a mask layer having corrosion resistance on each of two plane surfaces of a crystal substrate, exposing the resist layer formed on the first plane surface of the crystal substrate to radiation through a first mask on which a first mask pattern is drawn and exposing the resist layer formed on the second plane surface of the crystal substrate to radiation through a second mask on which a second mask pattern is drawn that differs in shape from the first mask pattern, forming a first resist layer pattern by patterning the resist layer on the first plane surface of the crystal substrate into a shape corresponding to the first mask pattern and forming a second resist layer pattern by patterning the resist layer on the second plane surface of the crystal substrate into a shape corresponding to the second mask pattern, forming a first mask layer pattern by patterning the mask layer on the first plane surface of the crystal substrate into a shape corresponding to the first mask pattern and forming a second mask layer pattern by patterning the mask layer on the second plane surface of the crystal substrate into a shape corresponding to the second mask pattern, and forming the crystal plate by etching the crystal substrate through the first mask layer pattern and the second mask layer pattern.

Preferably in the method according to the present invention, the first mask layer pattern has an outer shape that contains a portion of the base and a portion of the vibrating prong within a single plane, and the second mask layer pattern has an outer shape that contains another portion of the base and another portion of the vibrating prong within a single plane.

Preferably, in the method according to the present invention, the crystal plate includes at least a first vibrating prong and a second vibrating prong.

Preferably, in the method according to the present invention, the first and second mask layer patterns each have a crotch portion defined by a line that originates from the tip of the first vibrating prong, passes through the root of the first vibrating prong and through the root of the second vibrating prong, and leads to the tip of the second vibrating prong.

Preferably, in the method according to the present invention, the crotch portion of the first mask layer pattern and the crotch portion of the second mask layer pattern have different shapes.

Preferably, in the method according to the present invention, the number of bends contained in the crotch portion of the first mask layer pattern is different from the number of bends contained in the crotch portion of the second mask layer pattern.

Preferably, in the method according to the present invention, the angle of a bend contained in the crotch portion of the first mask layer pattern is different from the angle of a bend contained in the crotch portion of the second mask layer pattern.

Preferably, in the method according to the present invention, the number of center points representing curved sections contained in the crotch portion of the first mask layer pattern is different from the number of center points representing curved sections contained in the crotch portion of the second mask layer pattern.

Preferably, in the method according to the present invention, the curvature of a curved section contained in the crotch portion of the first mask layer pattern is different from the curvature of a curved section contained in the crotch portion of the second mask layer pattern.

One feature of the crystal device according to the present invention is that the two major faces of the crystal plate have different outer shapes, in particular, the crotch portions of the respective major faces have different shapes.

According to the crystal device of the present invention, the vibration of the (tuning-fork type) crystal plate can be stabilized, and as a result, a crystal device having high reliability and high accuracy can be achieved.

Further, according to the crystal device of the present invention, the processing step that has had to be performed after the etching step in the prior art in order to achieve stable vibration characteristics can be simplified or omitted, and as a result, productivity of the crystal device can be increased compared with the prior art.

Furthermore, when the crystal device of the present invention is used for a crystal gyro, the vibration can be stabilized, and therefore, the angular velocity can be detected accurately; as a result, a crystal gyro can be obtained that have high detection sensitivity and high accuracy.

According to the crystal device manufacturing method of the present invention, a crystal device having stable vibration characteristics can be formed, and as a result, a crystal device having high reliability and high accuracy can be produced.

Furthermore, according to the crystal device manufacturing method of the present invention, the processing step that has had to be performed after the etching step in the prior art in order to achieve stable vibration characteristics can be simplified or omitted, and as a result, productivity can be increased.

DETAILED DESCRIPTION OF THE PREFERRED EMBODIMENT

Figure 1:
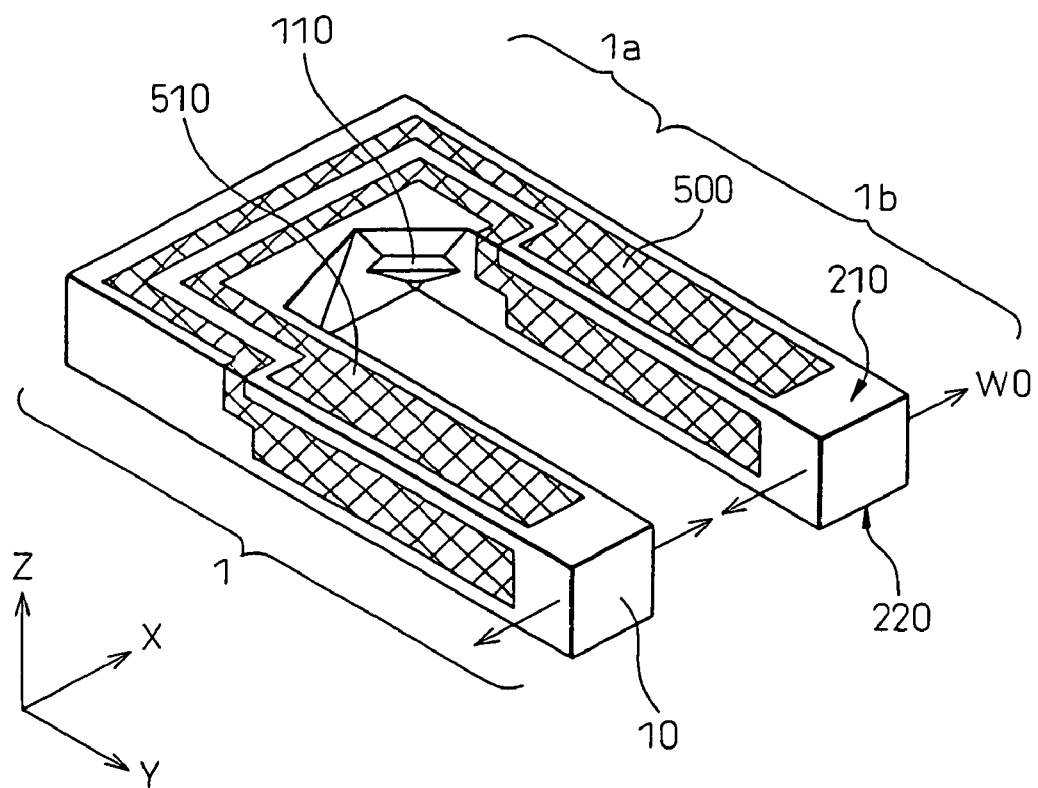
FIG. 1 is a diagram showing the structure of a crystal device 1 according to the present invention.

FIG. 1 is a diagram showing the structure of a crystal device 1 according to the present invention.

The crystal device 1 according to the present invention comprises a crystal plate 10 formed from a crystal, and electrodes 500 and 510. The crystal plate 10 is formed in the shape of a tuning fork which is made up of a base 1a and a plurality of vibrating prongs 1b protruding from the base 1a. The electrodes 500 and 510 are electrically separated from each other, and an electric field can be produced across the crystal plate 10 by applying different potentials to the respective electrodes. Since the crystal plate 10 is a piezoelectric material, the plate contracts or expands according to the direction of the applied electric field; this contracting/expanding motion causes the vibrating prongs 1b to vibrate. When a voltage is applied between the electrodes 500 and 510 of the crystal device 1, the two vibrating prongs 1b produce vibrations W0 along the X-axis direction.

In this patent specification, the portion defined by an outline extending from the tip to the first bend in the direction of the base will hereinafter be referred to as the "vibrating prong", the portion beyond the bend will be referred to as the "base", and the portion at the boundary between the base and the vibrating prong will be referred to as the "root".

The difference between the crystal device 1 of the present invention shown in FIG. 1 and the tuning-fork type crystal device of the prior art lies in the outer shape of the crystal plate 10, especially in the shapes of the two major faces 210 and 220 formed by the plane faces of the base 1a and vibrating prongs 1b of the crystal plate 10. In the embodiment of the present invention, the shape of the major face 210 is different from the shape of the major face 220, especially in the inter-mediate region connecting between the two vibrating prongs (that is, in FIG. 1, the portion that originates from the tip of one vibrating prong 1b, passes through the root of the one vibrating prong 1b and through the root of the other vibrating prong 1b, and leads to the tip of that other vibrating prong 1b (this portion is hereinafter referred to as the "crotch portion")). This constitutes one of the most important features of the present invention.

That is, while the shape of the crotch portion of the major face 210 contains three bends, the shape of the crotch portion of the major face 220 contains two bends (one of the two bends of the major face 220 is hidden from view in FIG. 1). In any prior art tuning-fork type crystal device, the two major faces 210 and 220 are not formed so as to have differently shaped crotch portions as described above, but are always formed in the same shape.

When the crotch portions of the two major faces 210 and 220 of the crystal plate 10 are formed in different shapes, the collateral effect is that the shape of the crystal plate (the shape of the unetched portion 110 formed on a side face of the crotch portion of the crystal plate 10) can be made different from that of the prior art. In the crystal device according to the present embodiment, stable vibration characteristics such as the vibrations W0 along the X axis shown in FIG. 1 can be obtained by forming the unetched portion 110 in an optimum shape.

Figure 2A:
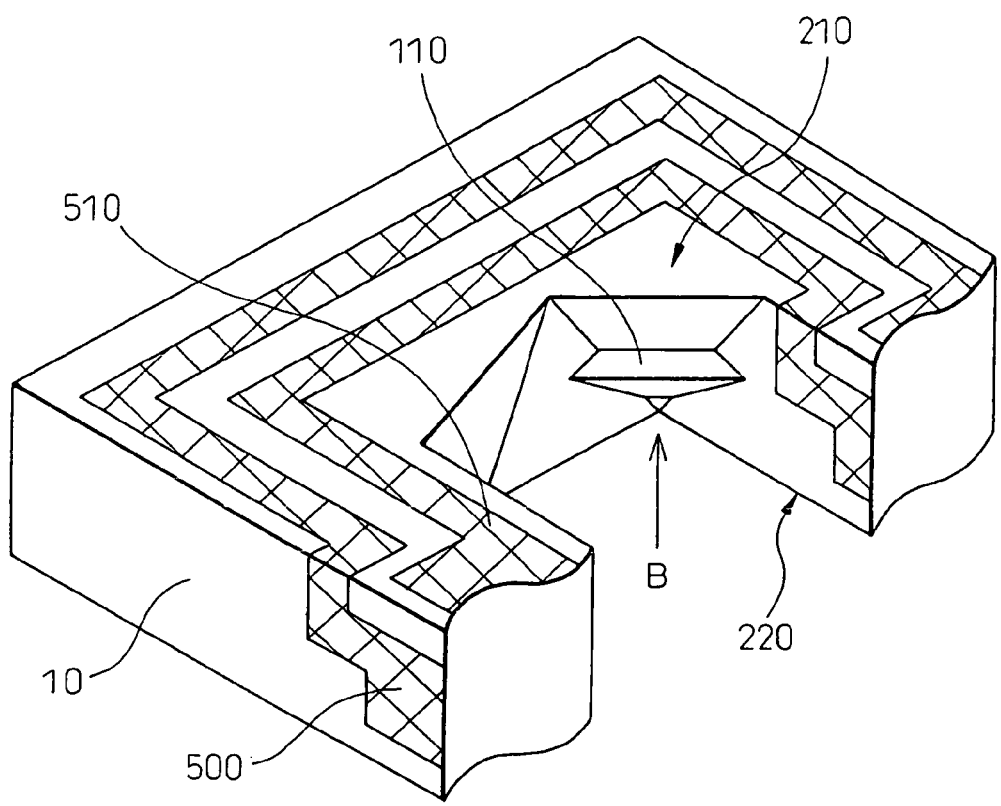
FIG. 2 is a diagram showing an enlarged view and a side view of a crotch portion and its adjacent regions in the crystal device 1 according to the present invention.
Figure 2B:
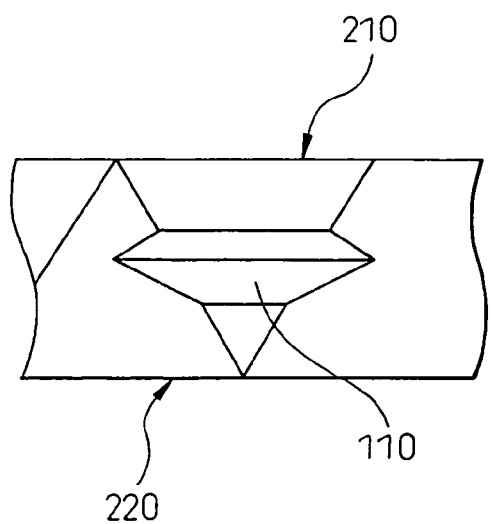

FIG. 2A is an enlarged view of the crotch portion and its adjacent regions in the tuning-fork type crystal device 1 shown in FIG. 1, and FIG. 2B is a diagram showing the shape of the side face as viewed from the direction B in FIG. 2A.

As shown in FIGS. 2A and 2B, the unetched portion 110 of the crystal device 1, which is left on the side face of the crotch portion of the crystal plate 10, is formed as a ridge-like protrusion having a ridge line substantially parallel to the two major faces 210 and 220. That is, the shape of the unetched portion 110 of the crystal device 1 is different from that of the prior art which has a ridge line extending obliquely between the two major faces. Furthermore, the size of the unetched portion 110 can be reduced (to about one quarter in terms of volume ratio) compared with the prior art (in which the same mask pattern 21b is used for both the major faces).

As described above, according to the present invention, the unetched portion 110 formed on the side face of the crotch portion of the crystal plate 10 can be made very small and can be formed in the shape of a protrusion having a ridge line substantially parallel to the two major faces 210 and 220. This, therefore, does not provide any straining prop to the root portion of the vibrating prong, and the vibrating prong can produce stable vibrations W0 along the X axis as designed.

A manufacturing method for the crystal device 1 will be described below.

FIG. 3 is a diagram showing the first half of the manufacturing process of the crystal device 1, FIG. 4 is a diagram showing the second half of the manufacturing process of the crystal device 1, and FIG. 7 is a diagram showing mask patterns used in the manufacturing process of the crystal device 1.

Figure 3A:
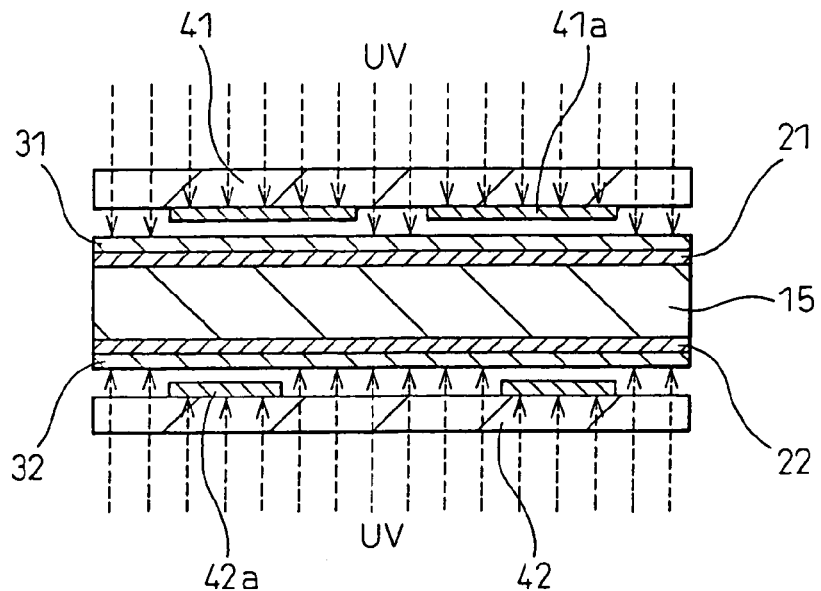
FIG. 3 is a diagram showing the first half of the manufacturing process of the crystal device 1 according to the present invention.

First, as shown in FIG. 3A, a crystal substrate 15 is prepared by forming mask layers 21 and 22 and resist layers 31 and 32 one on top of the other on the upper and lower plane surfaces of the substrate. The crystal substrate 15 used in the present embodiment is a substrate generally called a Z plate whose plane faces are substantially perpendicular to the crystallographic z-axis direction of the crystal (the plane faces make an angle of 85 to 95 degrees with respect to the Z axis).

Further, in the present embodiment, the mask layers 21 and 22 are each formed from a composite layer consisting of a chromium (Cr) film deposited to a thickness of 0.05 μm on the crystal substrate 15 and a gold (Au) film deposited to a thickness of 0.15 μm on the Cr film. The resist layers 31 and 32 are formed using a positive resist OFPR-800 manufactured by Tokyo Ohka Kogyo Co., Ltd.

One plane surface of the crystal substrate 15 on which the mask layer 21 and the resist layer 31 are formed and the other plane surface on which the mask layer 22 and the resist layer 32 are formed are exposed to UV radiation of prescribed wavelength through masks 41 and 42, respectively.

Figure 7A:
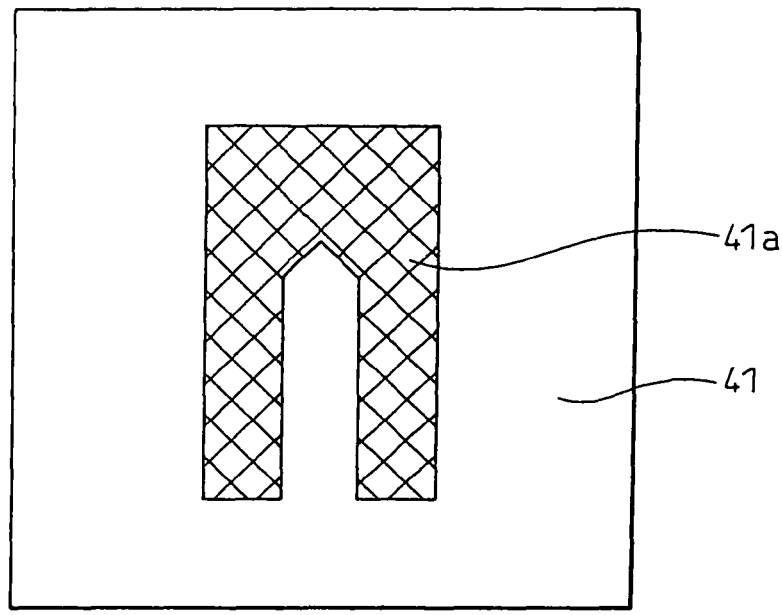
FIG. 7 is a diagram showing mask patterns used in the manufacturing process of the crystal device 1 according to the present invention.
Figure 7B:
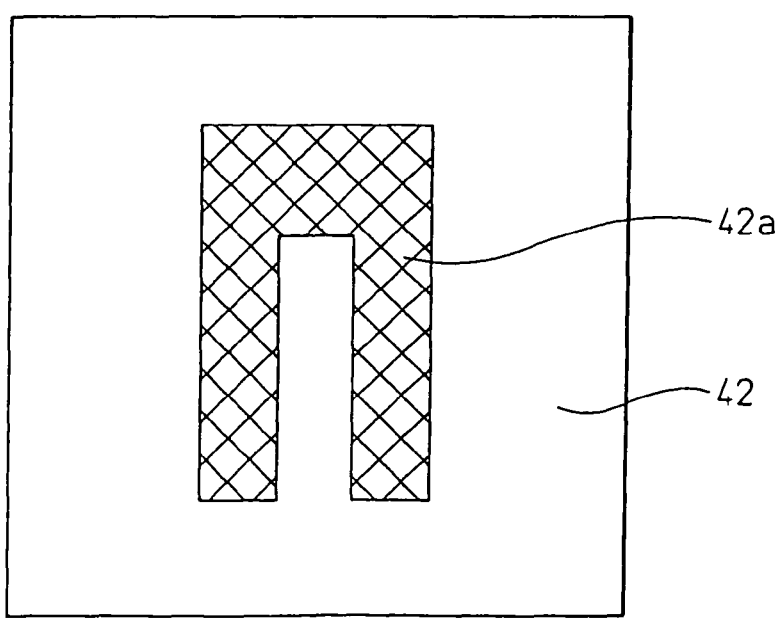

In the present embodiment, the mask pattern 41a drawn on the mask 41 and the mask pattern 42a drawn on the mask 42 are different in shape. The mask pattern 41a drawn on the mask 41 has an outer shape defining the plan shape of the base and the plan shapes of the two vibrating prongs, as shown in FIG. 7A. In the mask pattern 41a, the intermediate region (i.e., the crotch portion) connecting between the two vibrating prongs has a shape that contains three bends formed by bending a straight line. On the other hand, the mask pattern 42a formed on the mask 42 has an outer shape defining the plan shape of the base and the plan shapes of the two vibrating prongs, as shown in FIG. 7B. In the mask pattern 42a, the intermediate region (i.e., the crotch portion) connecting between the two vibrating prongs has a shape that contains two bends formed by bending a straight line. In this way, the shape of the crotch portion differs between the mask pattern 41a of the mask 41 and the mask pattern 42a of the mask 42; in particular, the number of bends contained in the crotch portion differs between them.

Figure 3B:
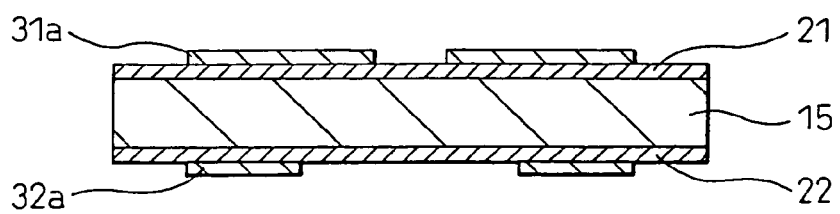

Next, the resist layers 31 and 32 are developed as shown in FIG. 3B, forming resist layer patterns 31a and 32a. In the present embodiment, the resist layers are developed using a developer specially prepared for OFPR-800.

Here, the resist layer pattern 31a is formed in the same shape as the mask pattern 41a of the mask 41, while the resist layer pattern 32a is formed in the same shape as the mask pattern 42a of the mask 42. That is, the resist layer pattern 31a has an outer shape defining the plan shape of the base and the plan shapes of the two vibrating prongs, and the crotch portion connecting between the two vibrating prongs in the resist layer pattern 31a has a shape that contains three bends. On the other hand, the resist layer pattern 32a has an outer shape defining the plan shape of the base and the plan shapes of the two vibrating prongs, and the crotch portion connecting between the two vibrating prongs in the resist layer pattern 32a has a shape that contains two bends.

Figure 3C:
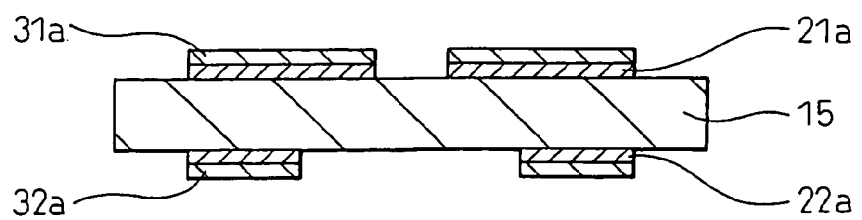

Next, using the resist layer patterns 31a and 32a as the masks, the mask layers 21 and 22 are etched as shown in FIG. 3C, forming mask layer patterns 21a and 22a. In the present embodiment, the mask layer patterns 21a and 22a are formed by etching the Au film in aqua regia and the Cr film in an etching solution of nitric acid.

Here, the mask layer pattern 21a, like the resist layer pattern 31a, is formed in the same shape as the mask pattern 41a of the mask 41, while the mask layer pattern 22a, like the resist layer pattern 32a, is formed in the same shape as the mask pattern 42a of the mask 42. That is, the mask layer pattern 21a has an outer shape defining the plan shape of the base and the plan shapes of the two vibrating prongs, and the crotch portion connecting between the two vibrating prongs in the mask layer pattern 21a has a shape that contains three bends. On the other hand, the mask layer pattern 22a has an outer shape defining the plan shape of the base and the plan shapes of the two vibrating prongs, and the crotch portion connecting between the two vibrating prongs in the mask layer pattern 22a has a shape that contains two bends.

Figure 3D:
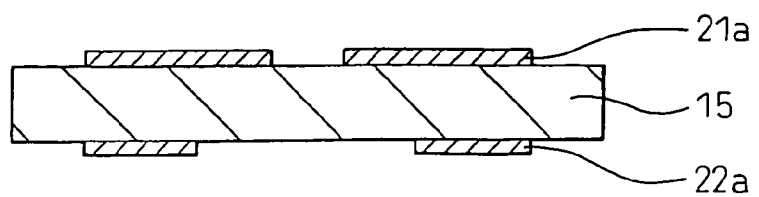

Next, by removing the resist layer patterns 31a and 32a, as shown in FIG. 3D, the mask layer patterns 21a and 22a are formed in different shapes on the respective plane surfaces of the crystal substrate 15. In the present embodiment, OFPR-800 used for forming the resist layer patterns 31a and 32a is removed using acetone.

Figure 4A:
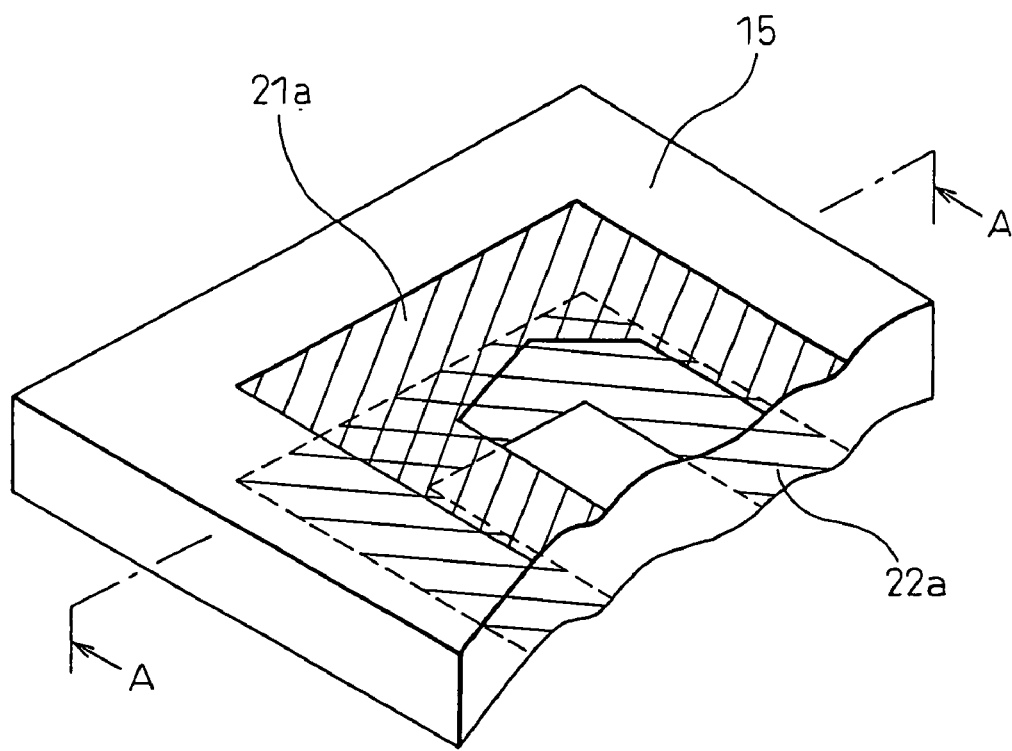
FIG. 4 is a diagram showing the second half of the manufacturing process of the crystal device 1 according to the present invention.

FIG. 4A is a diagram showing the mask layer patterns 21a and 22a formed in different shapes, as described above, on the plane surfaces of the crystal substrate 15. The A-A cross section of FIG. 4A is shown in FIG. 3D. By etching the crystal substrate 15 shown in FIG. 4A, the crystal plate 10 whose outer shape is defined by the mask layers 21a and 22a, and whose one major face is differently shaped than its other major face, is completed as shown in FIG. 4B.

Figure 5:
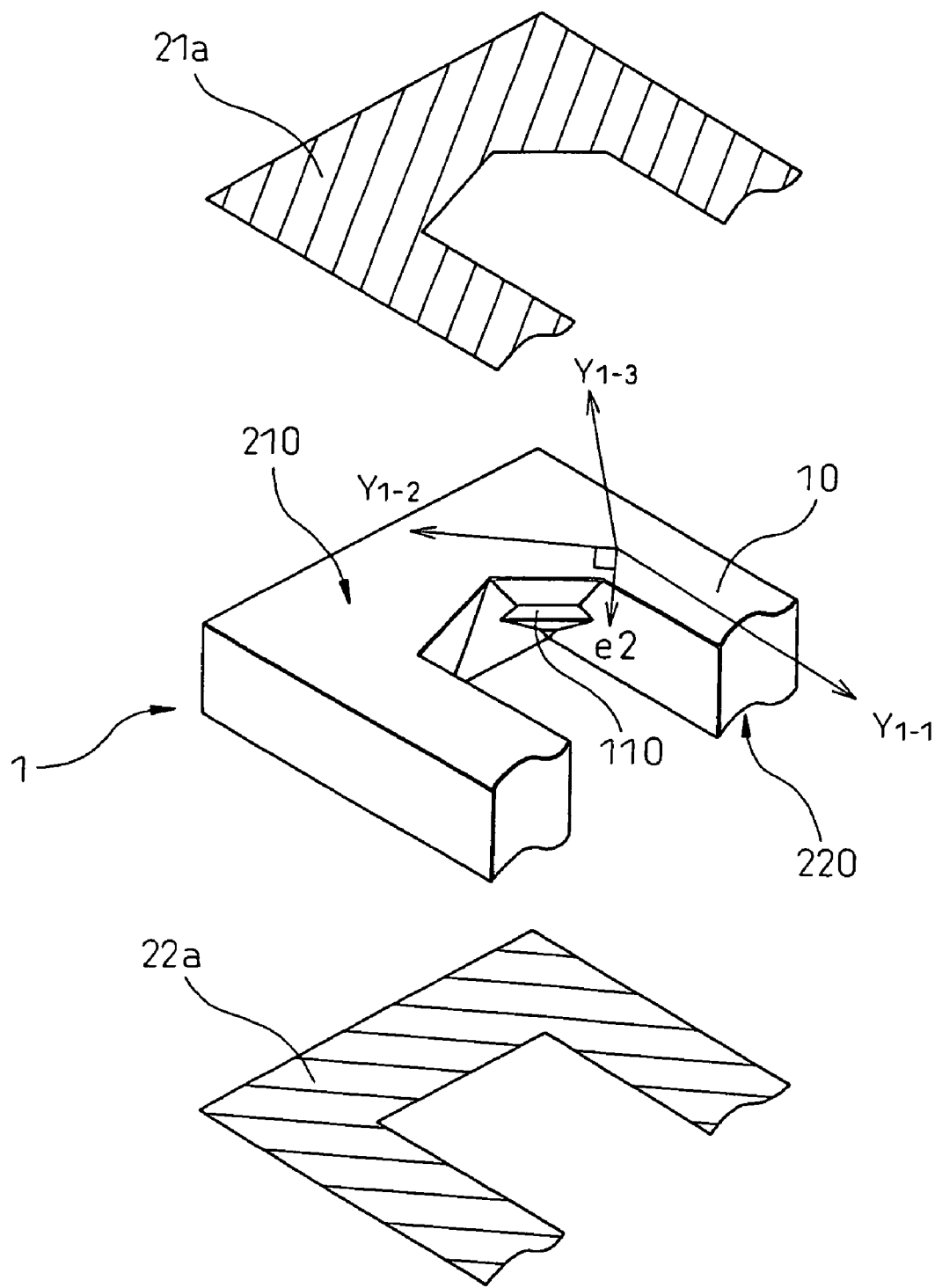
FIG. 5 is a diagram showing the shape of a crystal plate 10 and the shapes of mask layer patterns in the crystal device 1 according to the present invention.

FIG. 5 is a diagram showing the shape of the crystal plate 10 used in the crystal device 1 according to the present invention and the shapes of the mask layer patterns for comparison.

In the present embodiment, one major face 210 of the crystal plate 10 is formed in substantially the same shape as the mask layer pattern 21a, and has an outer shape defined by the plan shape of the base and the plan shapes of the two vibrating prongs, and the crotch portion connecting between the two vibrating prongs has a shape that contains three bends. On the other hand, the other major face 220 of the crystal plate 10 is formed in substantially the same shape as the mask layer pattern 22a, and has an outer shape defined by the plan shape of the base and the plan shapes of the two vibrating prongs, and the crotch portion connecting between the two vibrating prongs has a shape that contains two bends. Accordingly, in the present embodiment, the shape of the one major face 210 of the crystal plate 10 is different from that of the other major face 220.

Figure 4B:
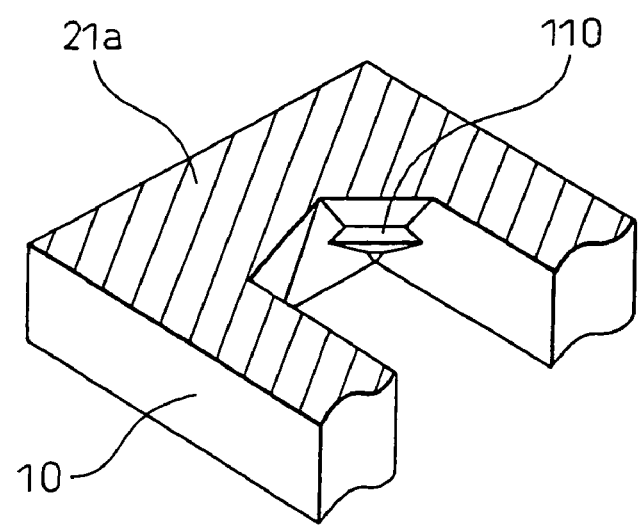

The crystal plate 10 formed by etching in FIG. 4B has an unetched portion 110 left unetched on the side face of the crotch portion connecting between the two vibrating prongs. This is due to the etching characteristic peculiar to the crystal. The crystal has the characteristic that its etch rate varies with its crystal orientation; this characteristic is generally known as the anisotropic etching characteristic. A protrusion such as the unetched portion 110 is necessarily formed on the side face of the crotch portion of the crystal plate 10 because of the effect of the anisotropic etching characteristic of the crystal.

In the present embodiment, however, the size of the unetched portion 110 can be greatly reduced compared with the prior art, because the shapes of the mask layer patterns 21a and 22a are determined by considering the anisotropic etching of the respective major faces, that is, for portions where the etch rate is slow, the patterns are formed with larger aperture in order to make such portions easier to etch but, for portions where the etch rate is fast, the patterns are formed with smaller aperture in order to make it difficult for the etching to proceed. Furthermore, in the present embodiment, the unetched portion 110 can be formed in a different shape than that of the prior art, that is, in the shape of a ridge-like protrusion having a ridge line substantially parallel to the two major faces 210 and 220. This is also the effect of the shapes of the mask layer patterns 21a and 22a.

In this way, the shapes of the mask layer patterns 21a and 22a are differently designed for the respective major faces by considering the anisotropic etching of the crystal. This also constitutes a feature of the present invention.

Through many experiments conducted by the present inventors, several combinations have been obtained for the optimum shapes of the mask layer patterns 21a and 22a. As a result, it has been found that the optimum shapes of the mask layer patterns 21a and 22a are not the same for the two major faces, but that the best results can be obtained when different shapes are used for the respective major faces.

Finally, the mask layer patterns 21a and 22a are removed, and the electrodes 500 and 511 are formed, to complete the fabrication of the tuning-fork type crystal device as shown in FIG. 1.

It has also been verified that the tuning-fork type crystal device 1 according to the present invention can be very effectively used for crystal gyros. In crystal gyros that utilize Coriolis forces, the Z-axis direction (the direction parallel to the Z axis which is one of the crystallographic axes of the crystal) is perpendicular to the vibration direction of the vibrating prongs, and is nothing but the direction of the angular velocity to be detected. In the tuning-fork type crystal device 1, as can be seen in the vibrations W0, hardly any vibrations occur in the Z-axis direction, so that only the component of the angular velocity to be detected can be accurately detected. As a result, when the tuning-fork type crystal device 1 according to the present invention is used, a crystal gyro can be achieved that has very good detection sensitivity and high reliability compared with the prior art.

Usually, in crystal gyros, the direction of the angular velocity to be detected is perpendicular to the vibration direction of the vibrating prongs, and the angular velocity cannot be detected accurately unless the vibration direction is stable as designed. With the crystal gyro using the crystal device of the present invention, on the other hand, the angular velocity perpendicular to the vibration direction can be accurately detected, because the vibration direction is stable as designed.

Next, a description will be given of the unetched portion.

As earlier described, in the crystal device 1 of the present invention, since the outer shapes of the two major faces of the crystal plate are made different from each other, the unetched portion remaining on the side face of the crotch portion of the crystal plate can be made very small. Furthermore, the unetched portion can be formed in the shape of a protrusion having a ridge line substantially parallel to the two major faces. Moreover, the unetched portion can be formed parallel to the major faces of the crystal plate in such a manner as to be substantially centralized on the side face of the crotch portion. In this way, the unetched portion whose shape is significantly different from that of the prior art constitutes a feature of the present invention.

Figure 15A:
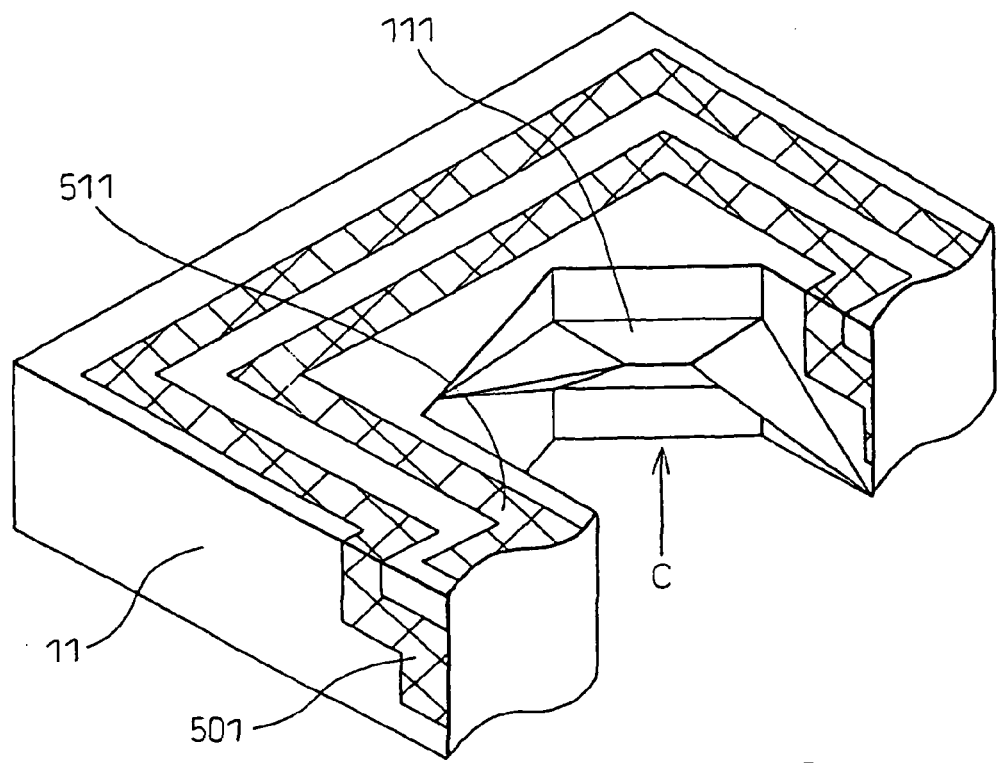
FIG. 15 is a diagram showing an enlarged view and a side view of the crotch portion of a tuning fork and its adjacent regions in the prior art tuning-fork type crystal device.
Figure 15B:
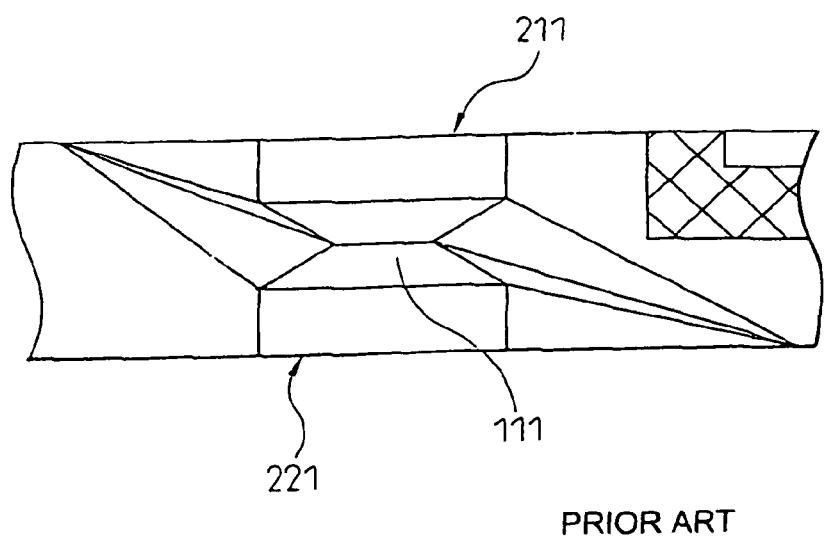
Figure 16A:
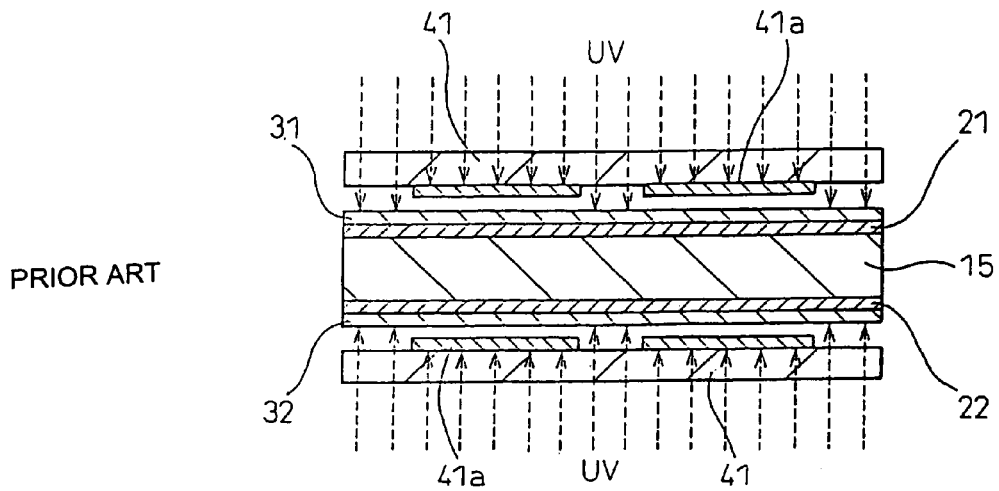
FIG. 16 is a diagram showing part of the manufacturing process of the prior art tuning-fork type crystal device.
Figure 16B:
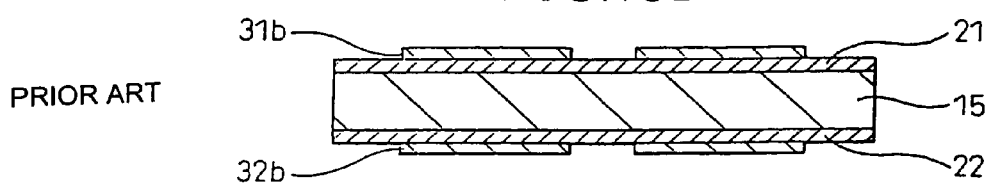
Figure 16C:
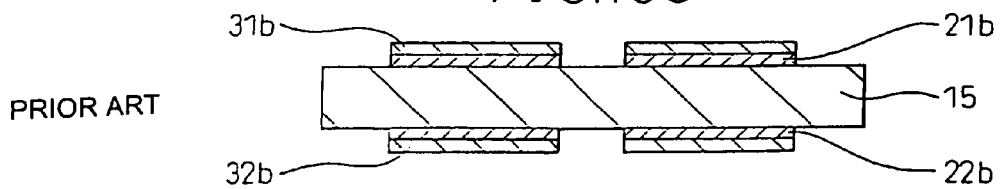
Figure 16D:
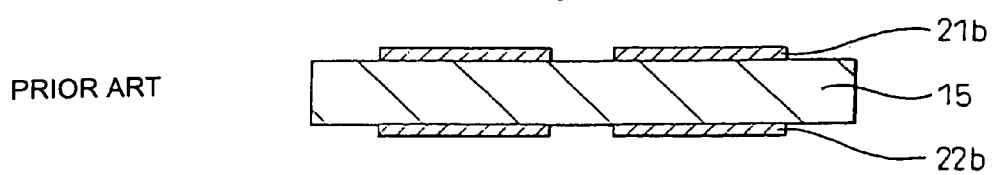
Figure 16E:
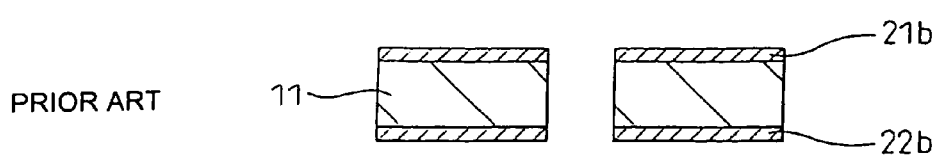
Figure 17:
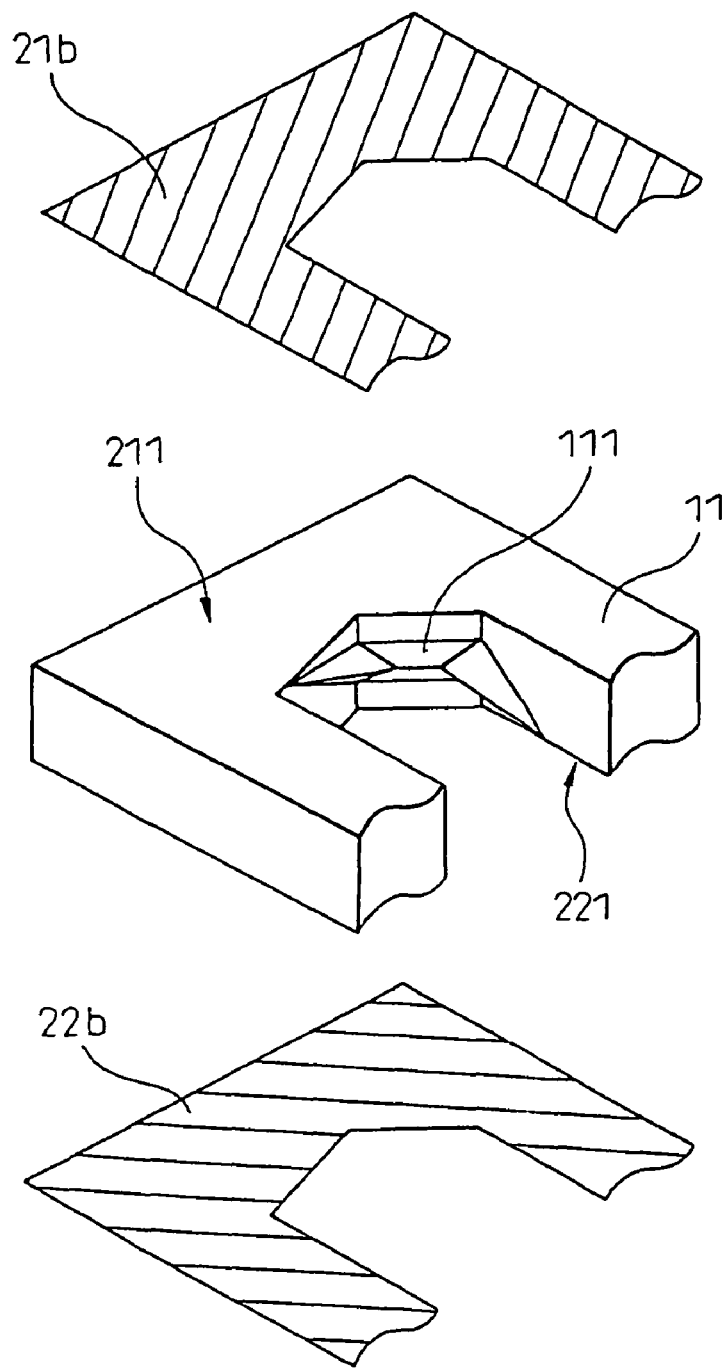
FIG. 17 is a diagram showing the shape of the crystal plate formed by etching according to the prior art and the shapes of mask layer patterns for comparison.

In the crystal plate used for the prior art crystal device, the unetched portion 111 was formed in a ridge-like shape on the side face of the crotch portion in such a manner as to extend across the side face of the crystal plate obliquely from one major face to the other major face (see FIG. 15B). This produced the same effect as if a prop had been placed obliquely across the root portion of the vibrating prong, causing the vibrating prong to vibrate in a direction tilted toward the Z-axis direction.

On the other hand, in the crystal device 1 of the present invention, since the unetched portion 110 is small in size, and is formed parallel to the major faces of the crystal plate in such a manner as to be substantially centralized on the side face of the crotch portion, as described above, the root portion of the vibrating prong is not physically strained, and the desired stable vibrations can be produced.

The unetched portion 110 is formed when the crystal substrate is etched. The shape of the unetched portion 110 is substantially determined by the shapes of the mask layer patterns formed in the step that precedes the etching step. The shape of the unetched portion 110 in the crystal device 1 of the present invention is achieved by making the shape of the mask layer pattern different between the upper and lower surfaces of the crystal substrate. This utilizes the etching characteristic that the etch rate differs between the upper and lower surfaces of the crystal substrate.

FIG. 6 is a diagram showing the etching characteristic of the crystal substrate formed from a conventional synthetic crystal.

Figure 6A:
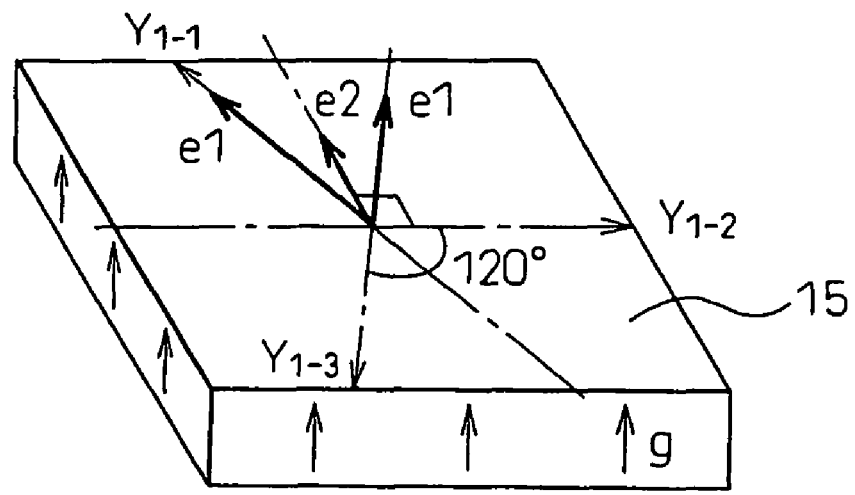
FIG. 6 is a diagram showing the etching characteristic of a crystal substrate formed from a conventional synthetic crystal.
Figure 6B:
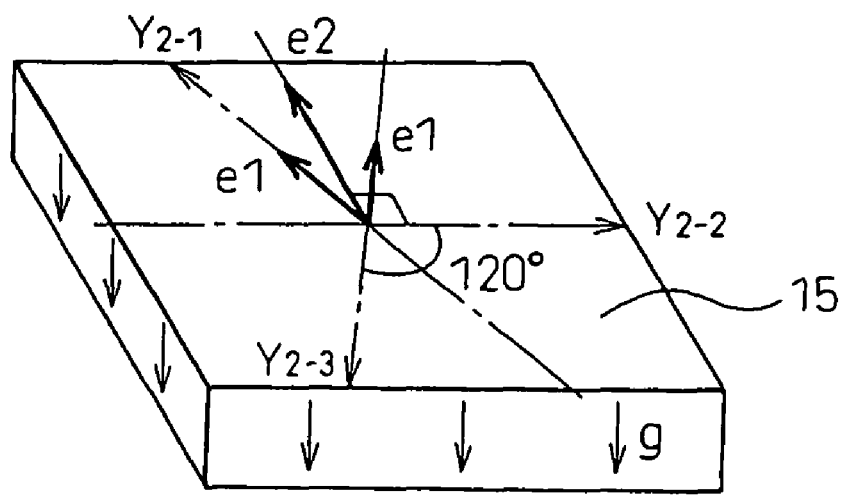

The crystal substrates 15 shown in FIGS. 6A and 6B are each a substrate cut so as to have plane faces substantially perpendicular to the crystallographic z axis (the thus cut substrate is generally called a "Z plate"). However, the growth direction "g" of the crystal in the crystal substrate of FIG. 6A is opposite to the growth direction "g" of the crystal in the crystal substrate of FIG. 6B. That is, FIGS. 6A and 6B represent the relationship between the front and back of the crystal substrate.

Usually, in the crystal substrate 15 (Z plate) cut so as to have plane faces perpendicular to the z axis as shown in FIG. 6A or 6B, there are three Y axes ($Y_{1-1}$ to $Y_{1-3}$ or $Y_{2-1}$ to $Y_{2-3}$) spaced 120 degrees apart from each other on each plane face.

If such crystal substrates 15 are etched using the same conditions, the etch rates e1 in directions parallel to the Y axes and the etch rate e2 in directions normal to the Y axes are different between the case of FIG. 6A and the case of FIG. 6B.

Generally, in the plane face toward which the growth proceeds in the direction "g" as shown in FIG. 6A, the etch rate e1 in the direction parallel to the Y axis ($Y_{1-1}$) and the etch rate e2 in the direction normal to the Y axis ($Y_{1-2}$) have the relationship defined by e1>e2. On the other hand, in the plane face from which the growth proceeds in the direction "g" as shown in FIG. 6B, the etch rate e1 in the direction parallel to the Y axis ($Y_{2-1}$) and the etch rate e2 in the direction normal to the Y axis ($Y_{2-2}$) have the relationship defined by e1<e2.

If the shapes of the mask layer patterns are designed by considering these etch rates e1 and e2, it becomes possible to form the crystal plate having the unetched portion as depicted in the present invention.

For example, suppose that the upper face 210 of the crystal plate 10 shown in FIG. 5 is formed as shown in FIG. 6A, and that the three Y axes ($Y_{1-1}$ to $Y_{1-3}$) in FIG. 6A are arranged as shown in FIG. 5. In this case, the direction e2 at right angles to the $Y_{1-2}$ axis substantially coincides with the projecting direction of the unetched portion 110. Since the etching is difficult to proceed in the direction e2, the unetched portion is formed in the direction e2.

FIG. 8 is a diagram showing a combination of mask patterns for an alternative crystal device 2 according to the present invention.

Figure 8A:
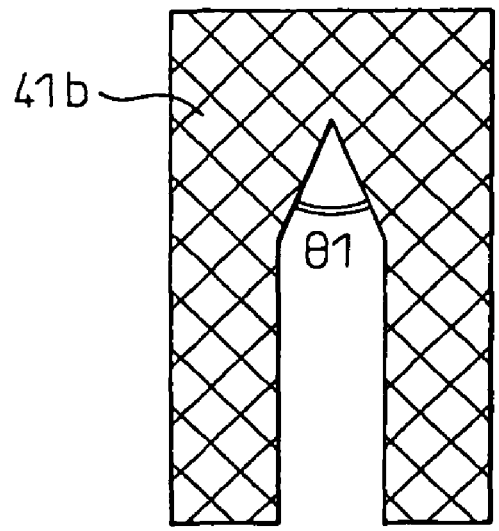
FIG. 8 is a diagram showing mask patterns used in the manufacturing method for an alternative crystal device 2 according to the present invention.
Figure 8B:
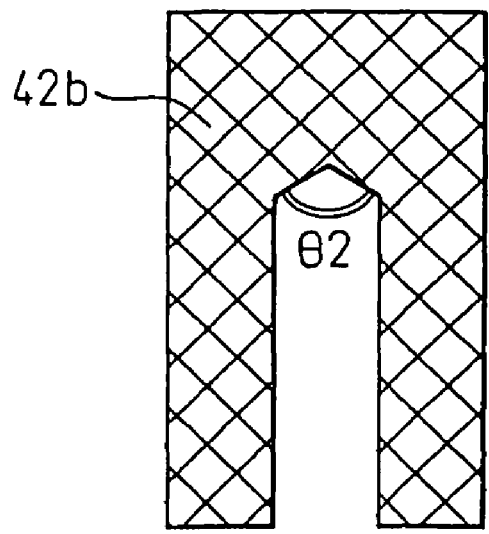

In the case of the alternative crystal device 2 according to the present invention, the tuning-fork type crystal device 2 is fabricated by using mask patterns 41b and 42b having different bend angles (θ1 and θ2) as shown in FIGS. 8A and 8B. The fabrication method of the crystal device 2 is the same as that shown in FIG. 3, except that the mask patterns are changed to the mask patterns 41b and 42b, and therefore, the description of the method will not be repeated here.

Figure 9:
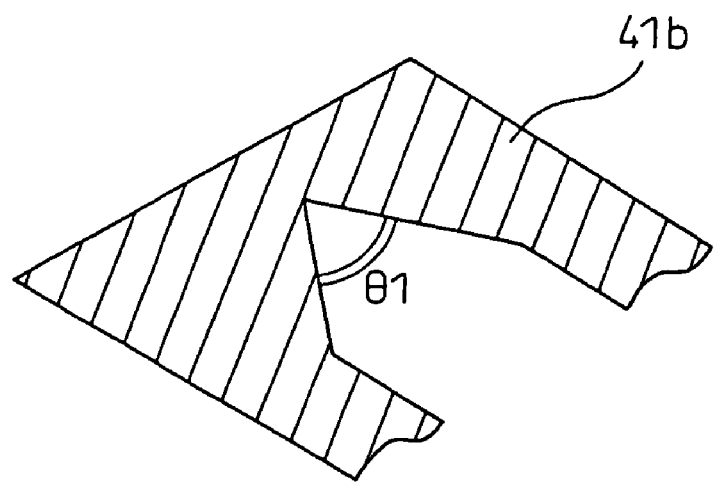
FIG. 9 is a diagram showing the shape of a crystal plate 12 and the shapes of mask layer patterns in the alternative crystal device 2 according to the present invention.
Figure 9:
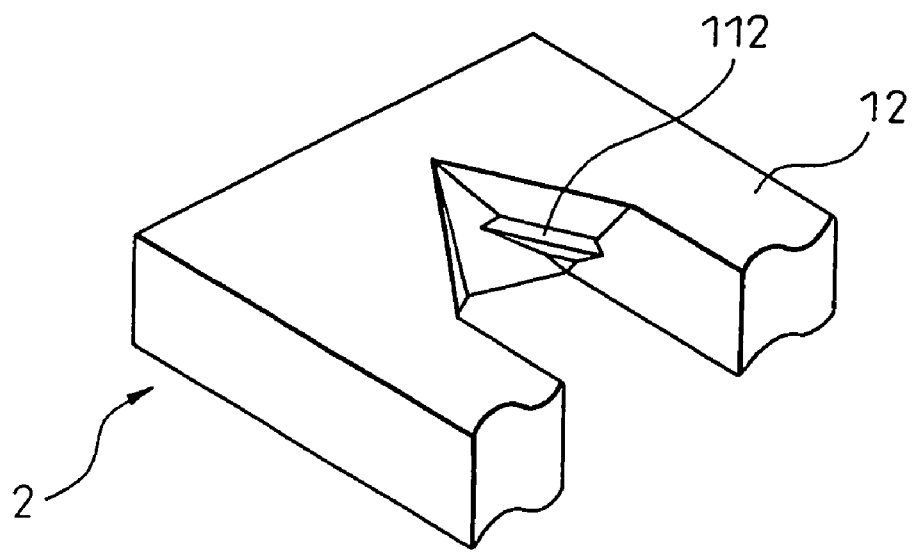
Figure 9:
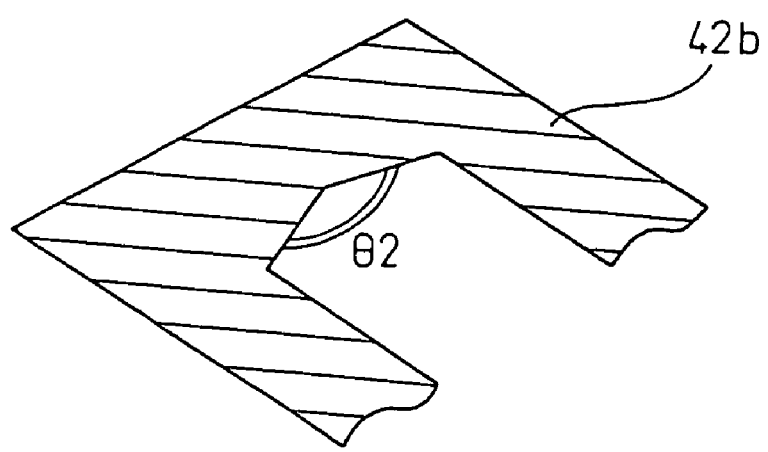

FIG. 9 is a diagram showing the shape of the crystal plate 12 used in the tuning-fork type crystal device 2 according to the present invention and the shapes of the mask layer patterns for comparison.

By using the mask patterns 41b and 42b that differ in the bend angle of the crotch portion, the crystal plate 12 can be fabricated that has two major faces that differ in the bend angle of the crotch portion. The unetched portion 112 left on the thus formed crystal plate 12 is shaped in the form of a protrusion having a ridge line substantially parallel to the two major faces. That is, the shape of the unetched portion 112 is different from that of the prior art which has a ridge line extending obliquely between the two major faces. Furthermore, the size of the unetched portion 112 can be reduced (to about four-ninths in terms of volume ratio) compared with the prior art (in which the same mask pattern 41b is used for both the major faces).

As a result, in the present embodiment also, there is no straining prop in the root portion of the vibrating prong, and the vibrating prong can produce stable vibrations along the X axis as designed, thus achieving the crystal device having high reliability and high accuracy.

FIG. 10 is a diagram showing a combination of mask patterns for a further alternative crystal device 3 according to the present invention.

Figure 10A:
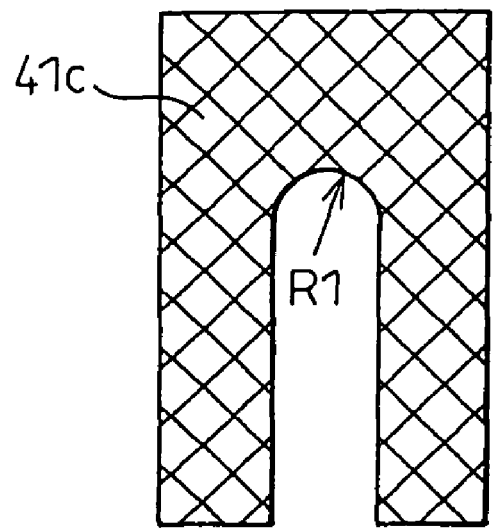
FIG. 10 is a diagram showing mask patterns used in the fabrication method for a further alternative crystal device 3 according to the present invention.
Figure 10B:
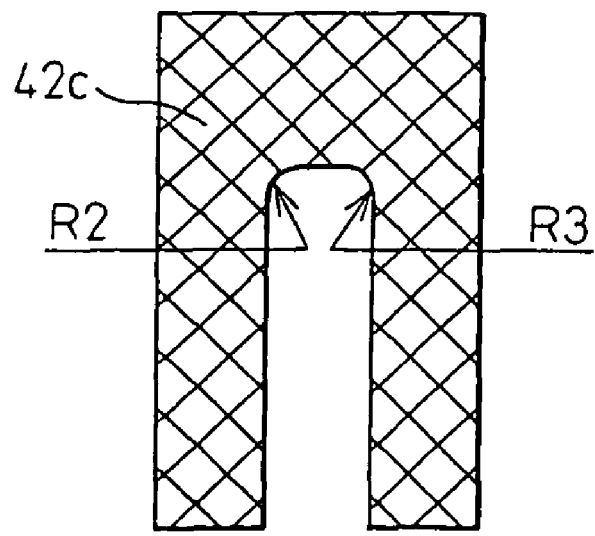

In the further alternative crystal device 3 according to the present invention, the tuning-fork type crystal device 3 is fabricating using mask patterns 41c and 42c that differ in the number of curved sections (R1, R2, R3) forming the crotch portion, as shown in FIGS. 10A and 10B. The fabrication method of the crystal device 3 is the same as that shown in FIG. 3, except that the mask patterns are changed to the mask patterns 41c and 42c, and therefore the description of the method will not be repeated here.

Figure 11:
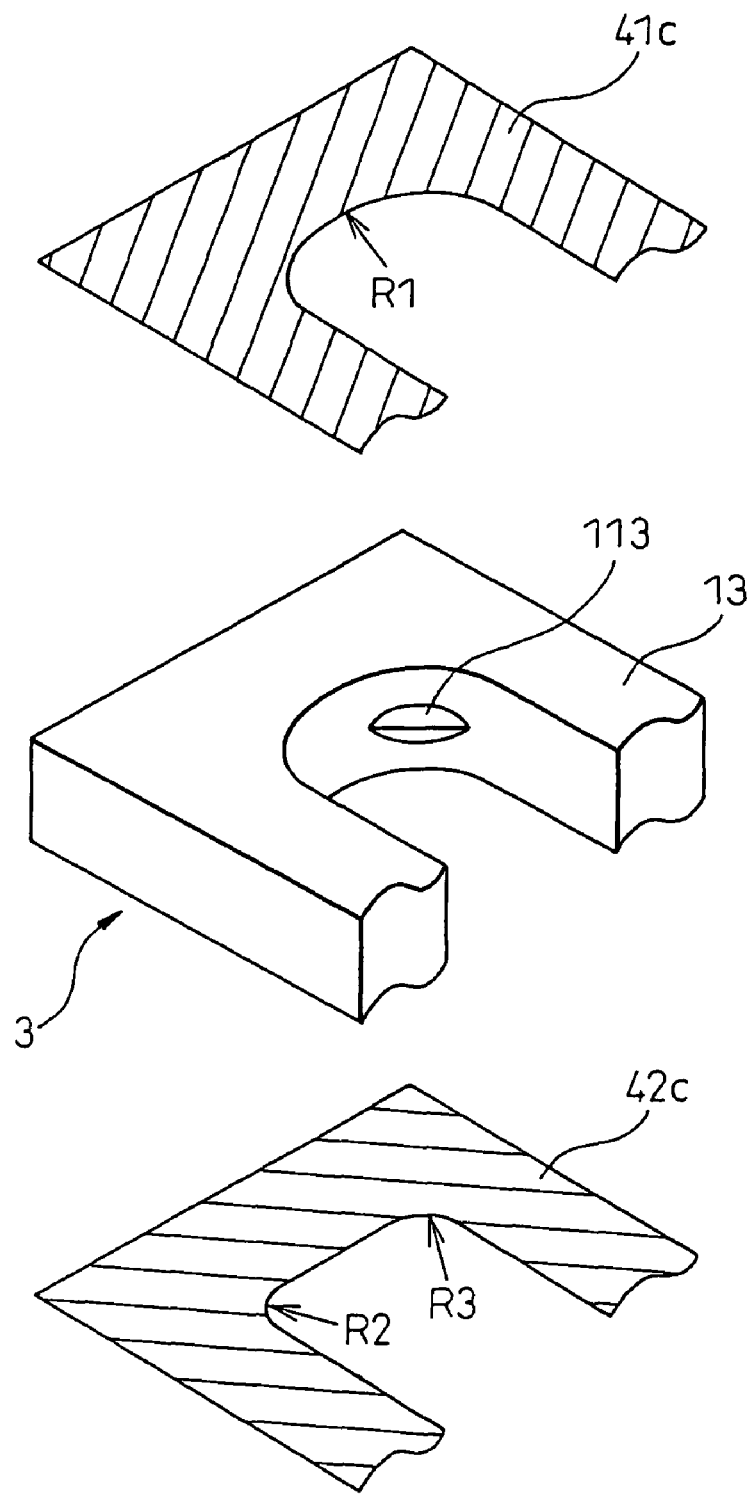
FIG. 11 is a diagram showing the shape of a crystal plate 13 and the shapes of mask layer patterns in the further alternative crystal device 3 according to the present invention.

FIG. 11 is a diagram showing the shape of the crystal plate 13 used in the tuning-fork type crystal device 3 according to the present invention and the shapes of the mask layer patterns for comparison.

By using the mask patterns 41c and 42c that differ in the number of curved sections forming the crotch portion, the tuning-fork type crystal device 3 can be fabricated that has two major faces that differ in the number of curved sections forming the crotch portion. The unetched portion 113 left on the thus formed crystal plate 13 is shaped in the form of a protrusion having a ridge line substantially parallel to the two major faces. That is, the shape of the unetched portion 113 is different from that of the prior art which has a ridge line extending obliquely between the two major faces. Furthermore, the size of the unetched portion 113 can be reduced (to about one quarter in terms of volume ratio) compared with the prior art (in which the same mask pattern 41c is used for both the major faces).

As a result, in the present embodiment also, there is no straining prop in the root portion of the vibrating prong, and the vibrating prong can produce stable vibrations along the X axis as designed, thus achieving the crystal device having high reliability and high accuracy. Here, in the present invention, it is to be understood that the number of curved sections forming the crotch portion is represented by the number of center points of the curved sections, and that a continuous curve having, for example, two center points is regarded as containing two curved sections.

FIG. 12 is a diagram showing a combination of mask patterns for a still further alternative crystal device 4 according to the present invention.

Figure 12A:
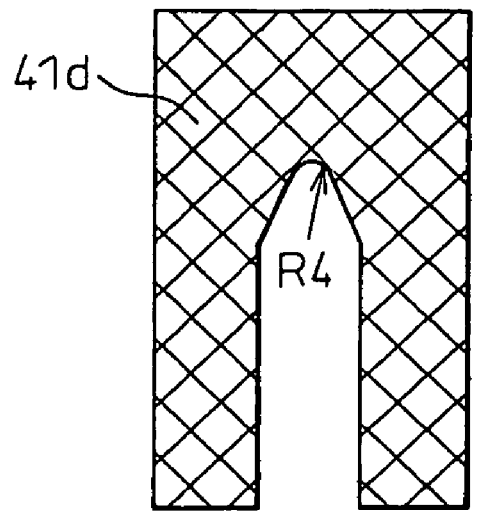
FIG. 12 is a diagram showing mask patterns used in the manufacturing method for a still further alternative crystal device 4 according to the present invention.
Figure 12B:
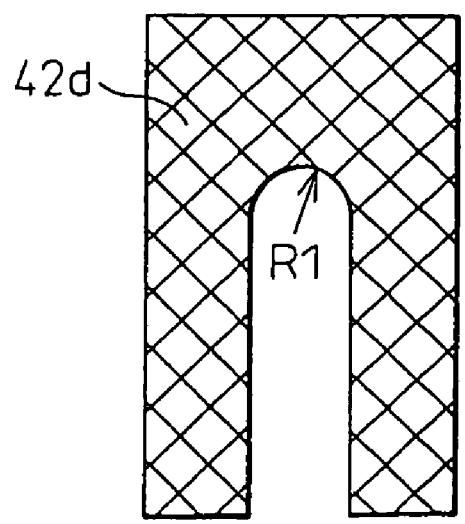

In the still further alternative crystal device 4 according to the present invention, the tuning-fork type crystal device 4 is fabricating using mask patterns 41d and 42d that differ in the curvature of the curve (R1, R2) forming the crotch portion, as shown in FIGS. 12A and 12B. The fabrication method of the crystal device 4 is the same as that shown in FIG. 3, except that the mask patterns are changed to the mask patterns 41d and 42d, and therefore the description of the method will not be repeated here.

Figure 13:
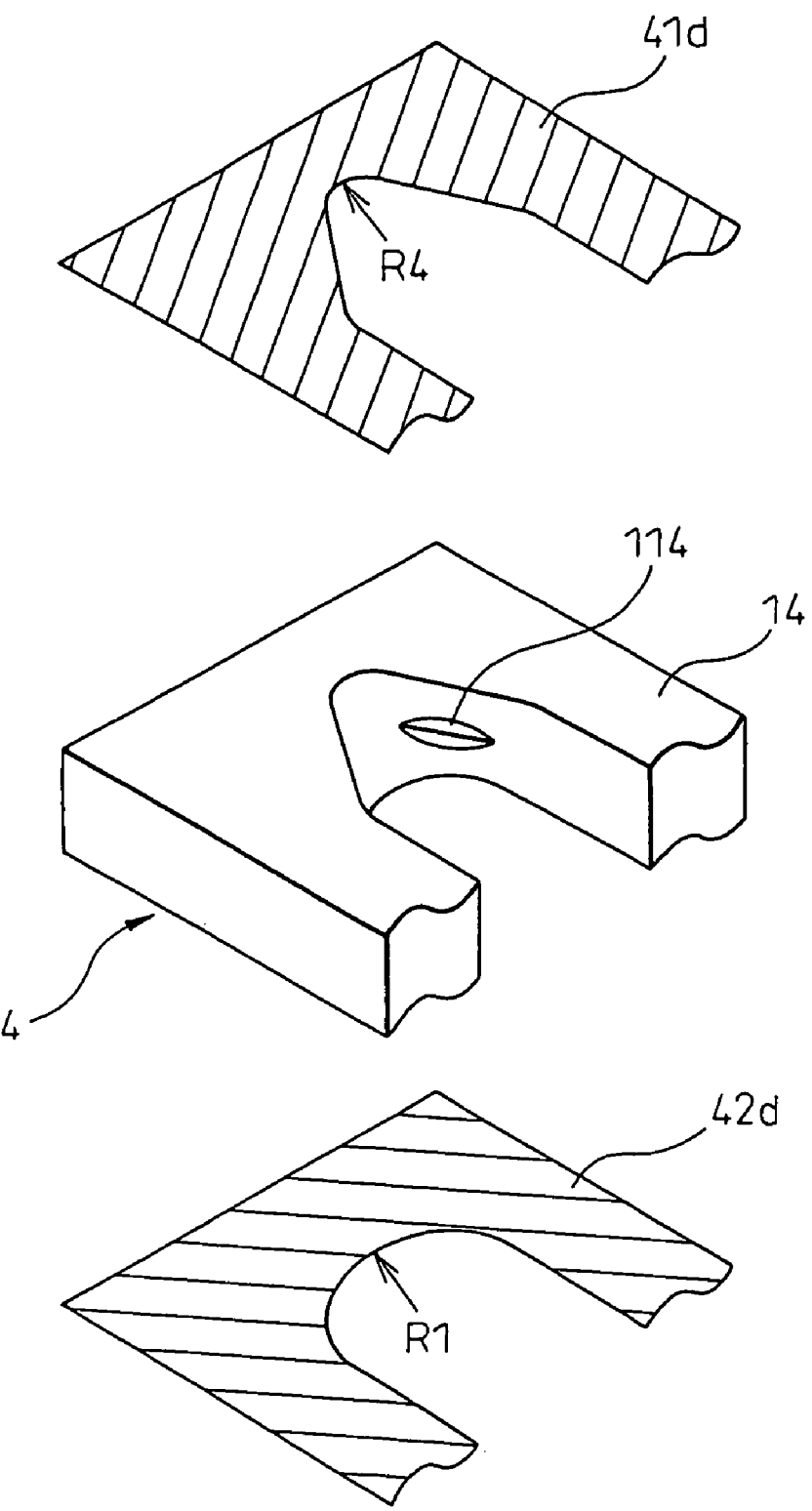
FIG. 13 is a diagram showing the shape of a crystal plate 14 and the shapes of mask layer patterns in the still further alternative crystal device 4 according to the present invention.
Figure 14:
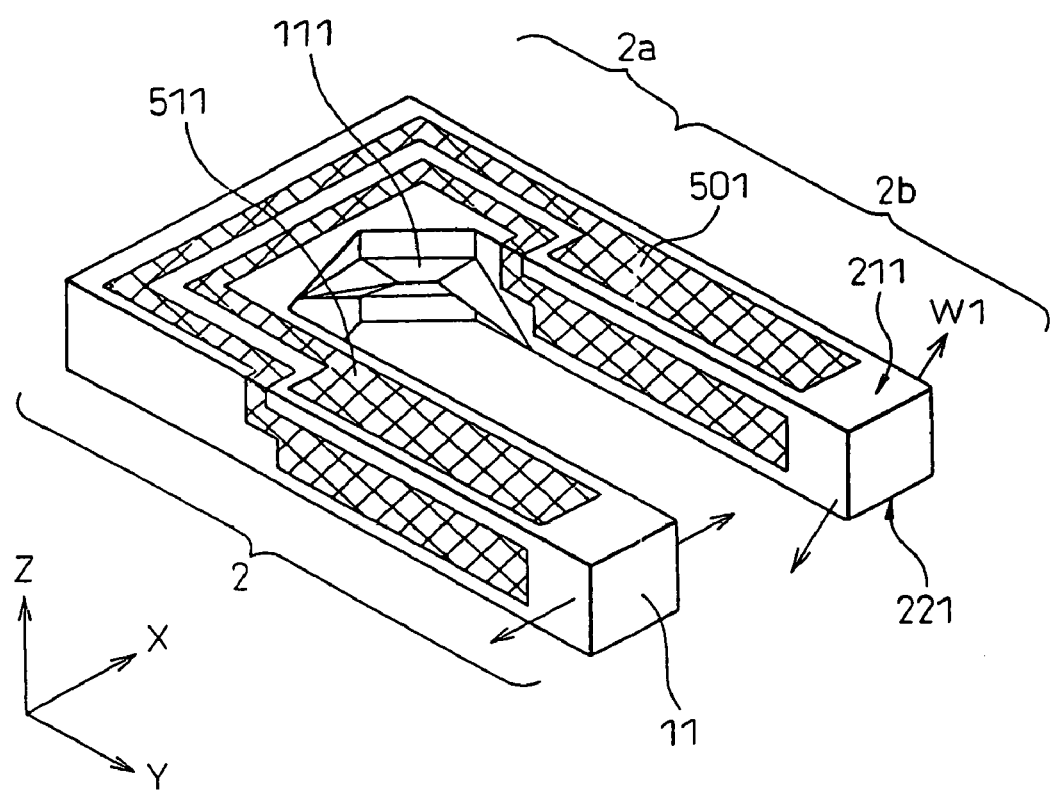
FIG. 14 is a diagram showing the structure of a prior art tuning-fork type crystal device.

FIG. 13 is a diagram showing the shape of the crystal plate 14 used in the tuning-fork type crystal device 4 according to the present invention and the shapes of the mask layer patterns for comparison.

By using the mask patterns 41d and 42d that differ in the curvature of the curve forming the crotch portion, the tuning-fork type crystal device 4 can be fabricated that has two major faces that differ in the curvature of the curve forming the crotch portion. The unetched portion 114 left on the thus formed crystal plate 14 is shaped in the form of a protrusion having a ridge line substantially parallel to the two major faces. That is, the shape of the unetched portion 114 is different from that of the prior art which has a ridge line extending obliquely between the two major faces. Furthermore, the size of the unetched portion 114 can be reduced (to about four-ninths in terms of volume ratio) compared with the prior art (in which the same mask pattern 41d is used for both the major faces).

As a result, in the present embodiment also, there is no straining prop in the root portion of the vibrating prong, and the vibrating prong can produce stable vibrations along the X axis as designed, thus achieving the crystal device having high reliability and high accuracy.

As described above, according to the present invention, the crystal devices 1 to 4 having high reliability and high accuracy can be achieved. When such crystal devices 1 to 4 are used for products such as crystal resonators and crystal oscillators, high reliability and accuracy can be obtained. Furthermore, when such crystal devices 1 to 4 are used for crystal gyros, the angular velocity can be detected accurately, and crystal gyros can be obtained that have high detection sensitivity and high accuracy.

Further, in the crystal devices 1 to 4 described above, not only can the size of the unetched portion be reduced compared with that of the prior art, but the unetched portion can be formed in the shape of a protrusion having a ridge line substantially parallel to the two major faces. Accordingly, in the crystal devices 1 to 4, the processing step performed after the etching step in the prior art in order to achieve stable vibration characteristics can be simplified or omitted, and productivity can thus be increased.

It will be recognized that the present invention is not limited to the combinations of differently shaped mask patterns used for the fabrication of the crystal devices 1 to 4 described above.

What is claimed is:

1. A method for manufacturing a crystal device having a crystal plate that includes a base and a vibrating prong including at least a first vibrating prong and a second vibrating prong protruding from said base, the method comprising the steps of:

forming a mask layer having corrosion resistance and a resist layer made of a photosensitive material on top thereof on each of two plane surfaces of a crystal substrate;

exposing the resist layer formed on a first of the two plane surfaces of said crystal substrate to radiation through a first mask on which a first mask pattern is drawn, and exposing the resist layer formed on a second of the two plane surfaces of said crystal substrate to radiation through a second mask on which a second mask pattern is drawn that differs in shape from said first mask pattern, wherein said first and second mask patterns each have a crotch portion defined by a line that originates from a tip of said first vibrating prong, passes through a root of said first vibrating prong and through a root of said second vibrating prong, and leads to a tip of said second vibrating prong, and an angle of a bend contained in the crotch portion of said first mask pattern is different from an angle of a bend contained in the crotch portion of said second mask pattern;

forming a first resist layer pattern by patterning the resist layer on the first plane surface of said crystal substrate into a shape corresponding to said first mask pattern, and forming a second resist layer pattern by patterning the resist layer on the second plane surface of said crystal substrate into a shape corresponding to said second mask pattern;

forming a first mask layer pattern by patterning the mask layer on the first plane surface of said crystal substrate into the shape corresponding to said first mask pattern, and forming a second mask layer pattern by patterning the mask layer on the second plane surface of said crystal substrate into the shape corresponding to said second mask pattern; and forming said crystal plate having a first major face and a second major face on said crystal plate by etching said crystal substrate through said first mask layer pattern and said second mask layer pattern, wherein said first major face contains a portion of said base, a portion of said first vibrating prong and a portion of said second vibrating prong within a single plane, and said second major face contains another portion of said base, another portion of said first vibrating prong and another portion of said second vibrating prong within a single plane and wherein the crotch portion of said first major face and the crotch portion of said second major face have different outer shapes.

2. A method for manufacturing a crystal device having a crystal plate that includes a base and a vibrating prong including at least a first vibrating prong and a second vibrating prong protruding from said base, the method comprising the steps of:

forming a mask layer having corrosion resistance and a resist layer made of a photosensitive material on top thereof on each of two plane surfaces of a crystal substrate;

exposing the resist layer formed on a first of the two plane surfaces of said crystal substrate to radiation through a first mask on which a first mask pattern is drawn, and exposing the resist layer formed on a second of the two plane surfaces of said crystal substrate to radiation through a second mask on which a second mask pattern is drawn that differs in shape from said first mask pattern, wherein said first and second mask patterns each have a crotch portion defined by a line that originates from a tip of said first vibrating prong, passes through a root of said first vibrating prong and through a root of said second vibrating prong, and leads to a tip of said second vibrating prong, and a number of center points representing curved sections contained in the crotch portion of said first mask pattern is different from a number of center points representing curved sections contained in the crotch portion of said second mask pattern;

forming a first resist layer pattern by patterning the resist layer on the first plane surface of said crystal substrate into a shape corresponding to said first mask pattern, and forming a second resist layer pattern by patterning the resist layer on the second plane surface of said crystal substrate into a shape corresponding to said second mask pattern;

forming a first mask layer pattern by patterning the mask layer on the first plane surface of said crystal substrate into the shape corresponding to said first mask pattern, and forming a second mask layer pattern by patterning the mask layer on the second plane surface of said crystal substrate into the shape corresponding to said second mask pattern; and forming said crystal plate having a first major face and a second major face on said crystal plate by etching said crystal substrate through said first mask layer pattern and said second mask layer pattern, wherein said first major face contains a portion of said base, a portion of said first vibrating prong and a portion of said second vibrating prong within a single plane, and said second major face contains another portion of said base, another portion of said first vibrating prong and another portion of said second vibrating prong within a single plane and wherein the crotch portion of said first major face and the crotch portion of said second major face have different outer shapes.

3. A method for manufacturing a crystal device having a crystal plate that includes a base and a vibrating prong including at least a first vibrating prong and a second vibrating prong protruding from said base, the method comprising the steps of:

forming a mask layer having corrosion resistance and a resist layer made of a photosensitive material on top thereof on each of two plane surfaces of a crystal substrate;

exposing the resist layer formed on a first of the two plane surfaces of said crystal substrate to radiation through a first mask on which a first mask pattern is drawn, and exposing the resist layer formed on a second of the two plane surfaces of said crystal substrate to radiation through a second mask on which a second mask pattern is drawn that differs in shape from said first mask pattern, wherein said first and second mask patterns each have a crotch portion defined by a line that originates from a tip of said first vibrating prong, passes through a root of said first vibrating prong and through a root of said second vibrating prong, and leads to a tip of said second vibrating prong, and a curvature of a curbed section contained in the crotch portion of said first mask pattern is different from a curvature of a curved section contained in the crotch portion of said second mask pattern;

forming a first resist layer pattern by patterning the resist layer on the first plane surface of said crystal substrate into a shape corresponding to said first mask pattern, and forming a second resist layer pattern by patterning the resist layer on the second plane surface of said crystal substrate into a shape corresponding to said second mask pattern;

forming a first mask layer pattern by patterning the mask layer on the first plane surface of said crystal substrate into the shape corresponding to said first mask pattern, and forming a second mask layer pattern by patterning the mask layer on the second plane surface of said crystal substrate into the shape corresponding to said second mask pattern; and forming said crystal plate having a first major face and a second major face on said crystal plate by etching said crystal substrate through said first mask layer pattern and said second mask layer pattern, wherein said first major face contains a portion of said base, a portion of said first vibrating prong and a portion of said second vibrating prong within a single plane, and said second major face contains another portion of said base, another portion of said first vibrating prong and another portion of said second vibrating prong within a single plane and wherein the crotch portion of said first major face and the crotch portion of said second major face have different outer shapes.

\* \* \* \* \*